United States Patent [19]

Wittig

[11] Patent Number: 6,011,498
[45] Date of Patent: *Jan. 4, 2000

[54] DUAL-SPEED VARIABLE LENGTH DECODING ARCHITECTURE FOR MPEG-2 VIDEO DATA

[75] Inventor: Karl R. Wittig, New York, N.Y.

[73] Assignee: Philips Electronics North America Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/772,078

[22] Filed: Dec. 20, 1996

[51] Int. Cl.$^7$ ........................................... H03M 7/40
[52] U.S. Cl. ............................................ 341/67; 341/65
[58] Field of Search ................................ 341/65, 67

[56] References Cited

U.S. PATENT DOCUMENTS

| | | | |
|---|---|---|---|
| 5,173,695 | 12/1992 | Ming-Ting Sun et al. | 341/67 |
| 5,550,542 | 8/1996 | Inoue | 341/67 |
| 5,604,498 | 2/1997 | Park | 341/67 |
| 5,625,355 | 4/1997 | Takeno et al. | 341/67 |
| 5,650,905 | 7/1997 | Bakhmutsky et al. | 341/67 |
| 5,675,331 | 10/1997 | Watanabe et al. | 341/67 |

FOREIGN PATENT DOCUMENTS 08167850  6/1996  Japan .

OTHER PUBLICATIONS

Database WPIL on Questel, week 9635, London: Derwent Publication Ltd., JO 8167850, abstract.

*Primary Examiner*—Howard L. Williams
*Attorney, Agent, or Firm*—Laurie E. Gathman

[57] ABSTRACT

An MPEG decoder includes a dual-speed variable length decoder (VLD) in which a code length determining portion in a feedback loop of the VLD, which loop also includes a barrel shifter and an adder-accumulator, is formed of two length tables, a high speed first length table for producing a code length determination within one clock cycle for the non-DC discrete cosine transform (DCT) coefficients and a slower speed second code length table which produces a code length determination generally in two or more clock cycles. A DCT coefficient run length decoder receives DCT coefficient codewords from the VLD consisting of level/run pairs and is configured for decoding any level/run pair in one clock cycle. By concentrating decoding speed on the variable length DCT coefficients which constitute much of the data in an MPEG data stream, sufficient decoding speed is obtained to handle MPEG-2 video as proposed for high definition television (HDTV).

11 Claims, 6 Drawing Sheets

DUAL-SPEED VARIABLE LENGTH DECODING ARCHITECTURE FOR MPEG-2 VIDEO DATA

BACKGROUND OF THE INVENTION

1. Field of the Invention

The present invention relates generally to high-speed decoding of video data which has been encoded in accordance with an MPEG (Moving Picture Experts Group) international standard. In its particular aspects, the present invention is directed to a variable length decoder (VLD) and a MPEG decoder including such VLD for decoding MPEG data at high speeds such as needed for digital High Definition Television (HDTV).

2. Description of the Related Art

A high speed variable length decoder (VLD) suitable for MPEG video is described in U.S. Pat. No. 5,173,695 to Sun et al., issued Dec. 22, 1992, which is incorporated herein by reference. Such VLD is used for decoding variable length codes, in particular discrete cosine transform (DCT) coefficients organized in blocks within a macroblock, which coefficients have been entropy coded in value and run length.

The Grand Alliance (GA) standard for digital HDTV transmission over terrestrial and cable networks has recently been ratified (with some modifications) by the United States Federal Communications Commission (FCC) paving the way for the introduction of HDTV transmitter and receiver equipment in the very near future. This standard uses the ISO/IEC 13818-2 international standard (MPEG-2) for video compression. The (GA) HDTV standard because of higher resolution than standard definition (SD) video, requires higher data transmission rates, and consequently a faster decoding speed by a factor of six at the receiver, than needed for SD video.

Because of speed limitations of available technology, meeting these higher decoding speeds is a significant challenge. There is a need to provide for a decoder and decoder architecture which is optimized to handle the increased speed required by the GA HDTV standard.

SUMMARY OF THE INVENTION

It is an object of the present invention to optimize the speed of decoding of an MPEG video data stream, given the speed limitations of the available technology. It is a further object of the present invention to provide a MPEG decoder for decoding MPEG video data at the high-speed required for HDTV.

The present invention is based on the recognition that the main "bottleneck" in the MPEG-2 video decoding process lies in the decoding of macroblocks, and in particular in the variable length decoding associated with the DCT coefficients of blocks. This is because data below the slice layer is almost entirely encoded using variable-length Huffman codes, and comprises most of the data in the stream. The present invention is further based on the recognition that, providing decoding of such data is optimized to be performed in one clock cycle, i.e. the time for synchronous presentation of a decoded pixel of a block at the output of the MPEG decoder, the remaining less-frequently occurring data may be decoded at a reduced rate, i.e. in two or more clock cycles.

In accordance with the present invention, a variable length decoder (VLD) comprises a feedback loop including a barrel shifter, a code length determining means and an adder-accumulator which is characterized in that the code length determining means comprises a first code length table means which produces a code length output signal for at least non-DC DCT coefficient codewords in a clock cycle after presentation to the first length table means of data lying in the decoding window of the barrel shifter, and a second code length table means which produces a code length output signal for at least one other MPEG variable length code in a period of time after presentation which is at least two clock cycles. Further, the first and second code length table means have respective control inputs via which they are selectively activated by a controller means in dependence on the type of variable length code being processed.

Also, in accordance with the invention, the first code length table means is implemented by a high speed combinatorial decoder such as a gate array.

An additional aspect of the present invention is that a DCT coefficient run length decoder coupled to receive DCT coefficient codewords from the VLD is configured for decoding level/run pairs (i.e. the level of a non-zero DCT coefficient and the number of zero DCT coefficients which precede it in a zigzag scan of the array of DCT coefficients of a block) in one clock cycle.

A still further feature of the present invention is that the clock cycle is less than a macroblock interval for synchronous presentation of macroblock layer data decoded by the MPEG decoder divided by the product of the number of blocks per macroblock and the number of pixels per block. This allows for a worst case situation having few or no zero DCT coefficients in a block.

Other objects, features and advantages of the present invention will become apparent upon perusal of the following detailed description when taken in conjunction with the appended drawing.

DETAILED DESCRIPTION OF THE PREFERRED EMBODIMENTS

Figure 1:
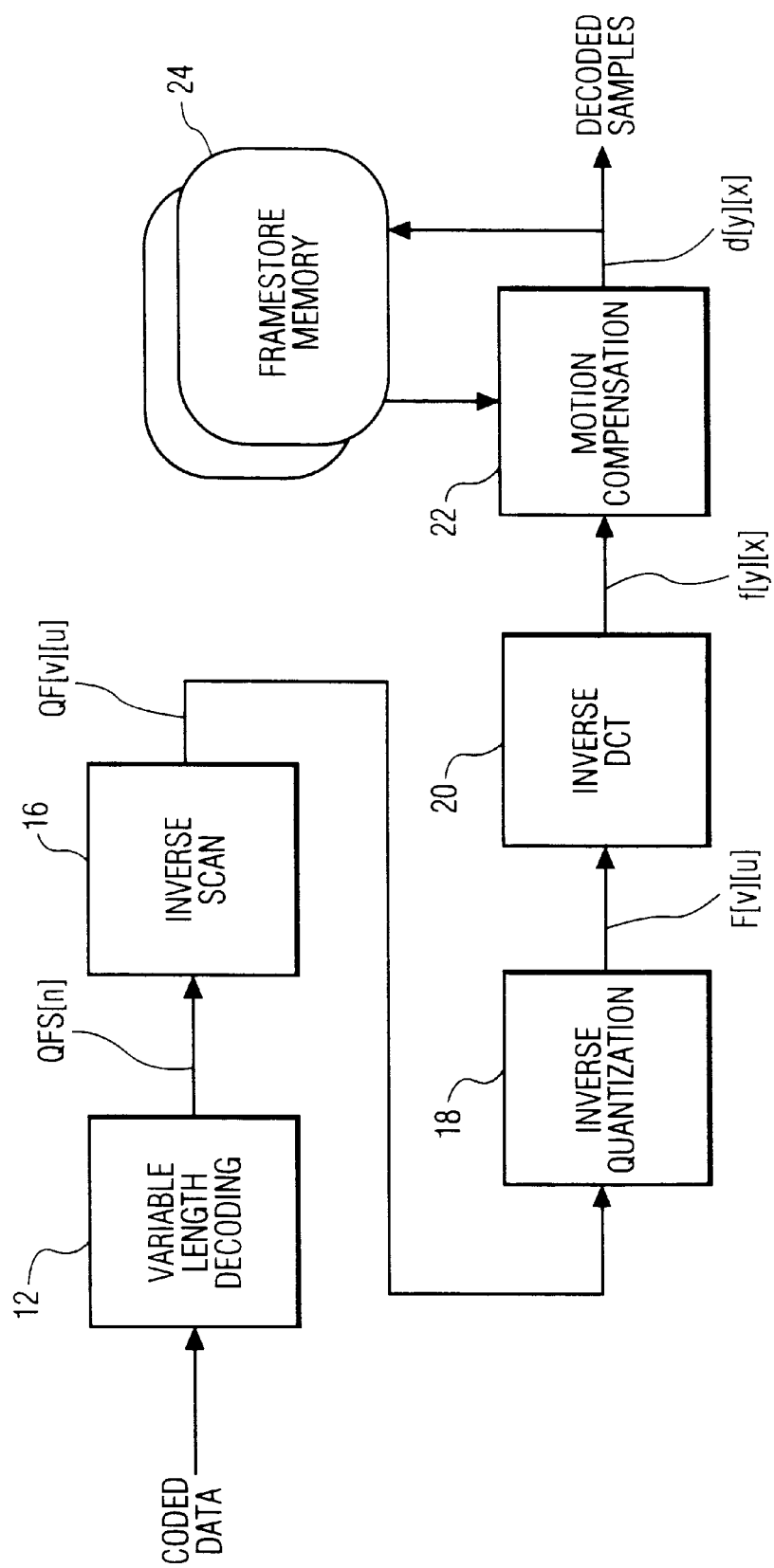
FIG. 1 is a block diagram of a simplified MPEG-2 decoding process.

The MPEG-2 decoding process is shown in FIG. 1 in which coded data is first subjected to variable length decoding in block 12, after which an inverse scan in block 16, an inverse quantization in block 18, an inverse DCT in block 20 and motion compensation in block 22 are performed to produce the decoded samples at the output of the MPEG decoder. The motion compensation utilizes past and future frames stored in a frame store memory 24. Subsequently, the decoded samples from the output of the MPEG decoder may be used to produce moving images which are displayed, after a scan conversion or other image composition functionality (not shown) appropriate to the nature of the display.

Figure 2:
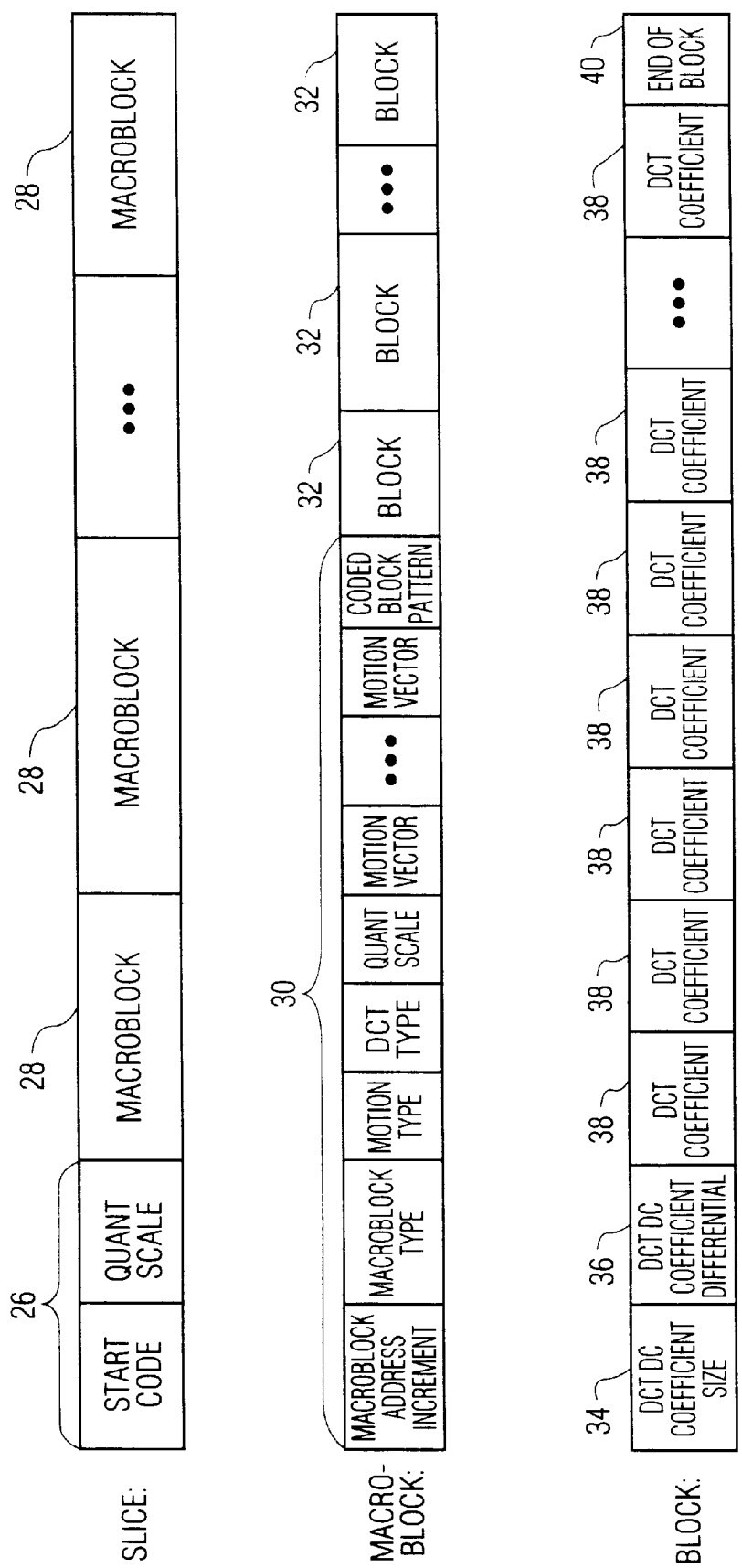
FIG. 2 shows the MPEG-2 slice layer structure.

The decoding of an MPEG video data stream is a hierarchical process consisting of several layers. The highest of these correspond, in descending order within the hierarchy, to a video sequence, a group of pictures, a picture, and a so-called slice. As shown in FIG. 2, the latter consists of a slice header 26 (containing start code and quantization scale) and row of macroblocks 28. Each macroblock 28 corresponds to 16 by 16 luminance pixels and the associated chrominance pixels. A macroblock is organized as a macroblock header 30 (containing macroblock address increment, macroblock type, motion type, DCT type, quantization scale, a plurality of motion vectors, and coded block pattern) in discrete cosine transform (DCT) blocks of 8 by 8 pixels each plus other data. Typically, there are 4 such blocks of DCT coefficients for luminance pixels and two such blocks of DCT coefficients for chrominance pixels per macroblock, although for greater chrominance resolution, there could be four or eight blocks of DCT coefficients for chrominance pixels per macroblock. In a block (within an intra-coded macroblock), the DCT DC coefficient is encoded by size 34 and differential 36 and all DCT coefficients, except the DC DCT coefficient, are run-length coded with a variable length code, in particular a Huffman code. Each code corresponds to a level/run pair representing the level of a non-zero DCT coefficient and the number of zero DCT coefficients which precede it in a zigzag scan of the array of DCT coefficients of a block. Given a variable number of run length coded DCT coefficients, an end of a block is distinguished by a code 40.

In an MPEG video stream, the data below the slice layer is almost entirely encoded using variable-length Huffman codes, and comprises most of the data in the stream. A practical MPEG decoder should be capable of decoding those portions of the stream that have the greatest amount of data at the highest possible speed, even if it means that the remaining, less-frequently occurring data is decoded at a reduced speed. The MPEG-2 slice structure is shown in FIG. 2.

The MPEG codes which occur in greatest numbers are those for the DCT coefficients, of which there can be as many as 64 per block, or 384 per macroblock (only the case of 4:2:0 video is considered here). In contrast, at most one DCT DC coefficient can occur in each block (6 in a macroblock), and not more than 21 MPEG codes in the macroblock header (in the case of MPEG-2 Main Profile, High Level). Clearly, the decoder architecture must be optimized for high-speed decoding of DCT coefficients.

The MPEG decoding standard specifies a different Huffman code table for each type of MPEG code, so that, for instance, DCT coefficients, DCT DC coefficients, and motion vectors must each be decoded using different tables. At any point in the decoding process, the decoder must know which table to use, as well as when to start using a different table. Of these tables, the one that contains the longest Huffman codes is that for DCT coefficients, which have a maximum length of 24 bits (a 6-bit escape sequence followed by a 6 bit run and 12 bit level). If MPEG-1 compatibility is to be maintained, the DCT coefficients have a maximum length of 28 bits. The decoder must be able to process each DCT coefficient, hence MPEG codes of at least this length, in a single clock cycle. By a clock cycle, is meant a period of time for presentation for synchronous presentation of a decoded pixel of a block. Such time must be somewhat less than a macroblock interval, the time for synchronous decoding of a macroblock, divided by the product of the number of blocks per macroblock (typically six) and the number of pixels per block (typically sixty-four). Other codes may be processed in 2 or even 3 clock cycles if this insures a faster decoding speed for the DCT coefficients.

Figure 3A:
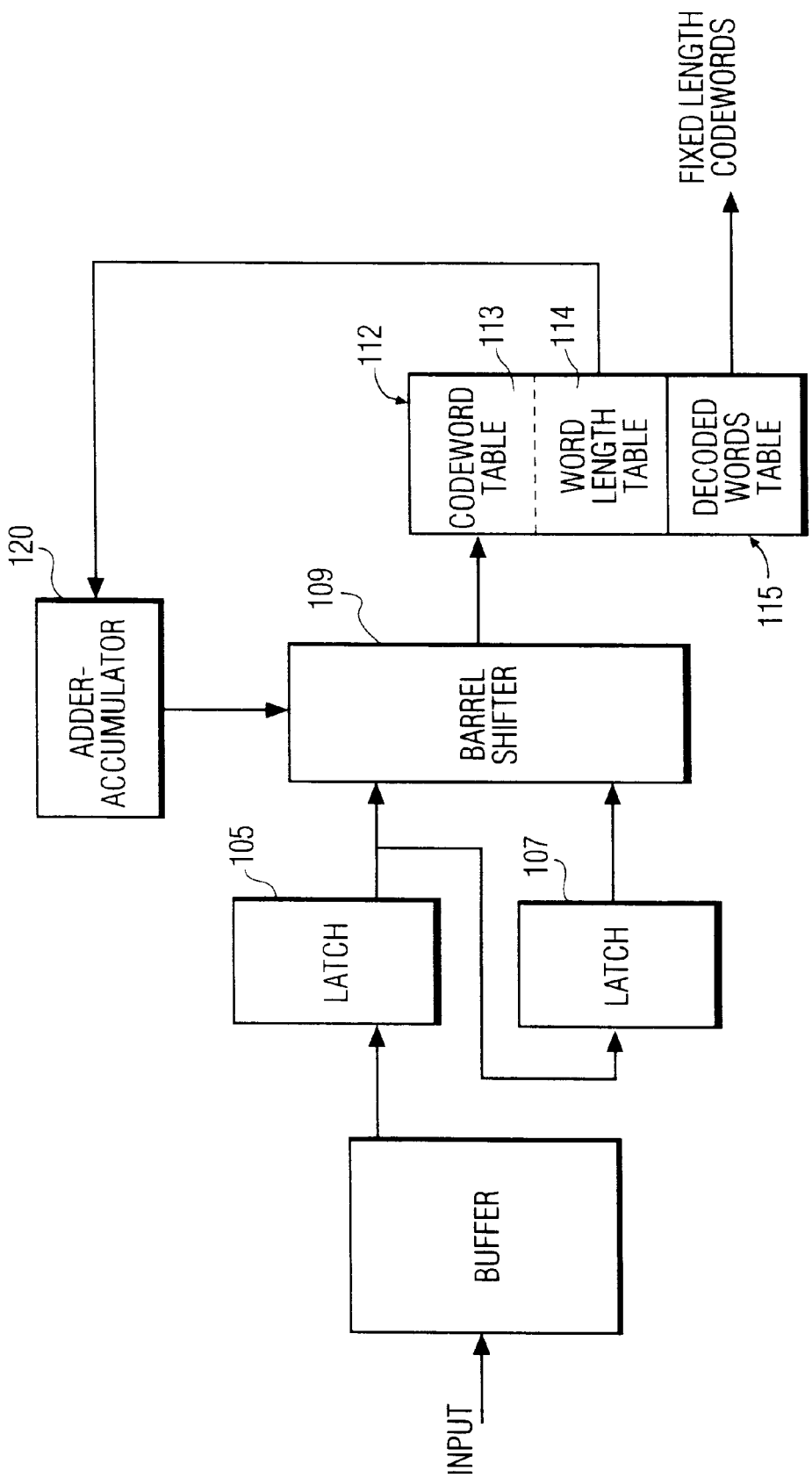
FIG. 3a is a block diagram of a variable-length decoder (VLD) structure in accordance with the prior art.

The first stage of MPEG slice-layer decoding, after data is removed from the MPEG video buffer, is the variable-length decoding of the Huffman codes. This procedure is generally implemented in hardware using a variable-length decoder (VLD). The design of a high speed VLD as described in the aforementioned U.S. Pat. No. 5,173,695 is shown in FIG. 3a and is generally indicated by the reference numeral 100. Therein, a received variable-word-length encoded bit stream is input to a video buffer 102 and read out in parallel sequences equal in length to the maximum length codeword. These sequences are read into cascaded latches 105, 107. The data stream segment constituting the cascaded sequences in both latches is input to a barrel-shifter 109 which provides a sliding decoding window to a code-length table 112 (formed by a codeword table 113 and word-length table 114). To detect each codeword, the initial bits in the decoding window are compared with the codeword entries in table 113. When a codeword is detected, the corresponding stored codeword length in table 114 is accumulated in adder accumulator 120 with previously accumulated codeword lengths to shift the decoding window relative to the data stream segment by the number of bits in the last codeword. When all the bits in the first latch 105 have been assigned to codewords, the next bit sequence in the buffer is input to the second latch while the previous bit sequence in the second latch is transferred to the first latch. The decoding window is then adjusted to the beginning of the next undecoded sequence.

This known VLD 100 parses a complete codeword from the MPEG stream in a single operation. The stream is thus parsed into a sequence of variable-length MPEG codes, each of which is then mapped by decoded words table 115 into an internal fixed-length representation for subsequent stages of the decoding process. Clearly, the decoding speed of the VLD depends on the propagation speed of the feedback path formed by the barrel-shifter, code-length lookup-table 112, and adder-accumulator 120. Of these the code-length table will shortly be seen to be the most important. A fundamental incompatibility between prior art VLD 100 and the requirements of MPEG decoding is that, in the latter, more than one Huffman code is used, hence a size table is needed for each code as is a means of determining and selecting the correct code-length table at any time.

Figure 3B:
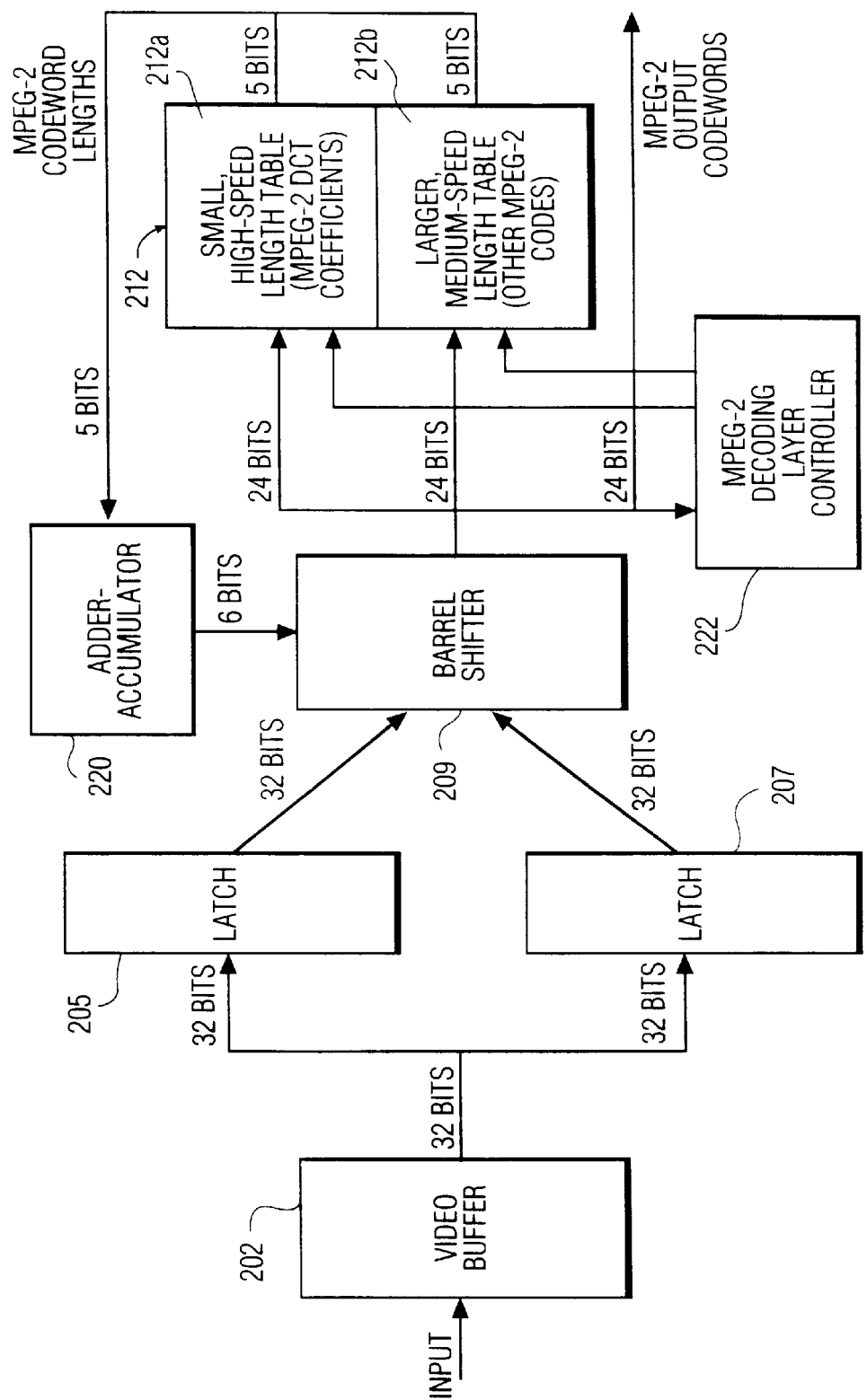
FIG. 3b is a block diagram of a VLD structure for high-speed decoding of MPEG-2 in accordance with the present invention.

A VLD structure for high-speed MPEG decoding in accordance with the present invention is shown in FIG. 3b and generally indicated by the reference numeral 200. Therein, a video buffer 202 receives the input data stream and provides successive 32 bit parallel data words to latches 205 and 207 in a manner that latch 207 always receives the data previously in latch 205. The 64 bit data segment from latches 205 and 207 are presented to the barrel-shifter 209. A bus width of 32 bits is required because this is the smallest power of 2 that still exceeds the maximum DCT coefficient code length of 24 (28 for MPEG-1), thus guaranteeing that a complete DCT coefficient code can always be processed contiguously and hence in one clock cycle. It also has the advantage of being the exact length of an MPEG start code, which is used to reset the VLD. The decoding speed must also be optimized by reducing the propagation delay of the feedback path.

In a similar manner to the prior art VLD 100 shown in FIG. 3a, the decoding window output of barrel-shifter 209 is applied to code-length table 212 to determine a code-length which is accumulated with prior code-lengths in adder-accumulator 220 to shift the barrel shifter relative to the decoding window by the code-length of the just considered codeword. In accordance with the present invention, code-length table 212 comprises a small high-speed length table 212a for MPEG-2 DCT coefficients and a larger medium-speed length table or set of tables 212b for other MPEG-2 codes. The applicable length table is selected by MPEG-2 decoding layer controller 222.

Implementations of high-speed barrel-shifters and adder-accumulators have been sufficiently addressed in prior art and will not be discussed here. The code-length table 212, however, is typically implemented in the prior art using a ROM. This is not practical for any code with a large maximum length, as the size of the ROM table increases exponentially with the number of input bits, and the speed of such devices decreases with size. The DCT coefficient table 212a should be implemented using a high-speed combinatorial decoder such as a gate array, which is selected by controller 222 when the VLD is in this decoding mode so that these codes may be parsed as rapidly as possible. This insures the decoding of every DCT coefficient in one clock cycle, and allows a higher clock frequency to be used at the same time.

The parsing of all other types of MPEG codes may be done with the larger code-length table or set of tables 212b, which may be implemented in any efficient, economical manner. In these modes, if the propagation delay exceeds that for parsing of the DCT coefficients, a second, or even third clock cycle may be used, as these codes occur in far fewer numbers in the MPEG stream. The resulting structure is a dual-mode or dual-speed VLD, which operates in a high speed "turbo mode" when decoding DCT coefficients, and at a slower speed when decoding other kinds of MPEG data.

Although the variable-length decoding operation represents the "bottleneck" in the MPEG decoding process, the same considerations described for its implementation apply to all subsequent stages as well. Consequently, every DCT coefficient must be decoded in one clock cycle. This consists of run-length decoding, in which the location of a coefficient within a DCT block is determined by that of the previous nonzero coefficient and the run value, which equals the number of zero coefficients preceding the current one; the value of the coefficient is just that of the level. Another crucial decoder function is the conversion of the variable number of coefficient code words that occurs in each block (this may even be zero in the case of a skipped block or macroblock) into a DCT block that always has 64 coefficients. This requires "synchronization" of the VLD operation with the video timing of the decoder, which in turn requires starting and stopping the VLD at appropriate times.

Figure 4:
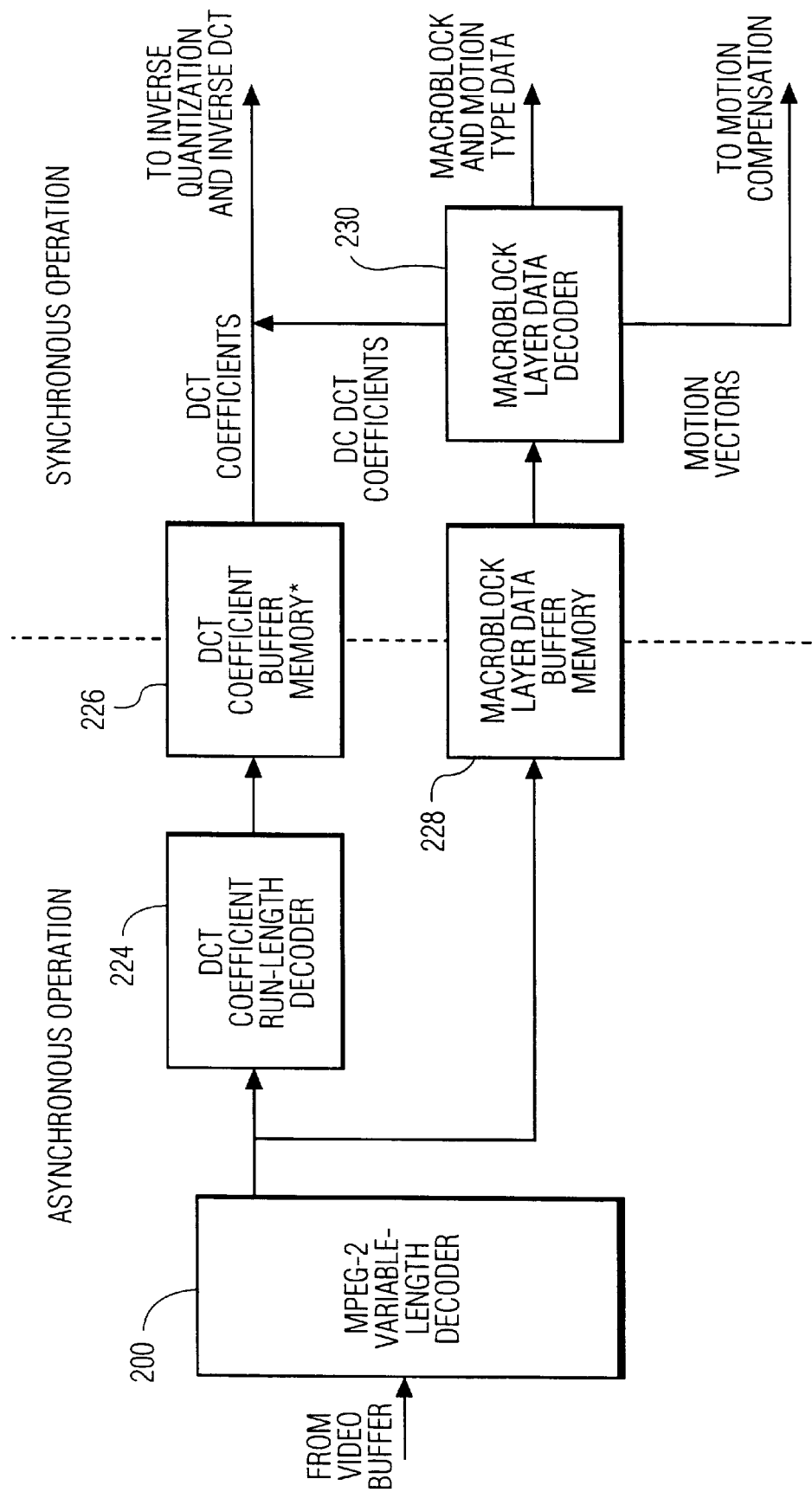
FIG. 4 is a block diagram of high-speed MPEG-2 decoder architecture in accordance with the present invention utilizing the VLD structure of FIG. 3b.

An MPEG slice-layer decoder architecture that meets the above requirements is shown in FIG. 4 wherein VLD 200 supplies MPEG-2 DCT codewords to DCT coefficient run-length decoder 224. A high-speed buffer memory 226 is used to store DCT coefficients (it can be used for DCT DC coefficients as well, but this is not necessary), and a second memory 228 is used to store all other macroblock data. The sizes of these memories can be chosen to buffer a DCT block, a macroblock, or a row of macroblocks (up to 120 in the GA standard), as long as VLD operation is synchronized to the corresponding interval. In any case, the number of clock cycles needed to process a macroblock, which equals the maximum number of MPEG codes, is greater than the number of DCT coefficients/pixels (i.e. "gaps" are needed between them to allow for "overhead" processing).

The macroblock data buffer memory 228 provides data to the macroblock data decoder which decode DC DCT coefficients (if they are not previously decoded and provided to DCT coefficient memory 226) macroblock and motion type data and motion vectors for motion compensation.

The choice of a macroblock row interval has the advantage of allowing the VLD 200 to operate in a continuous mode for entire MPEG slices, which may result in a slight increase in speed (due to less propagation delay within the VLD), but also has the disadvantage of requiring a large DCT coefficient buffer memory 226. A smaller interval is thus preferable. A DCT block interval requires the smallest possible DCT coefficient buffer, with the second buffer memory 228 storing the small amount of macroblock-layer data. One design of a DCT coefficient buffer that has been described uses two identical memories, one into which all incoming DCT coefficients are written after all locations have been cleared to zero, and the other simultaneously read out over the appropriate interval and in the desired order. The latter capability can be used to perform the inverse scan function required for MPEG decoding. Inverse quantization and DCT processing are then performed, using standard methods, to generate the residual pixels for each DCT block. The evaluation of DC coefficients and of macroblock and slice header data can also be performed using conventional methods, as there is very little such data within any decoding interval.

Figure 5:
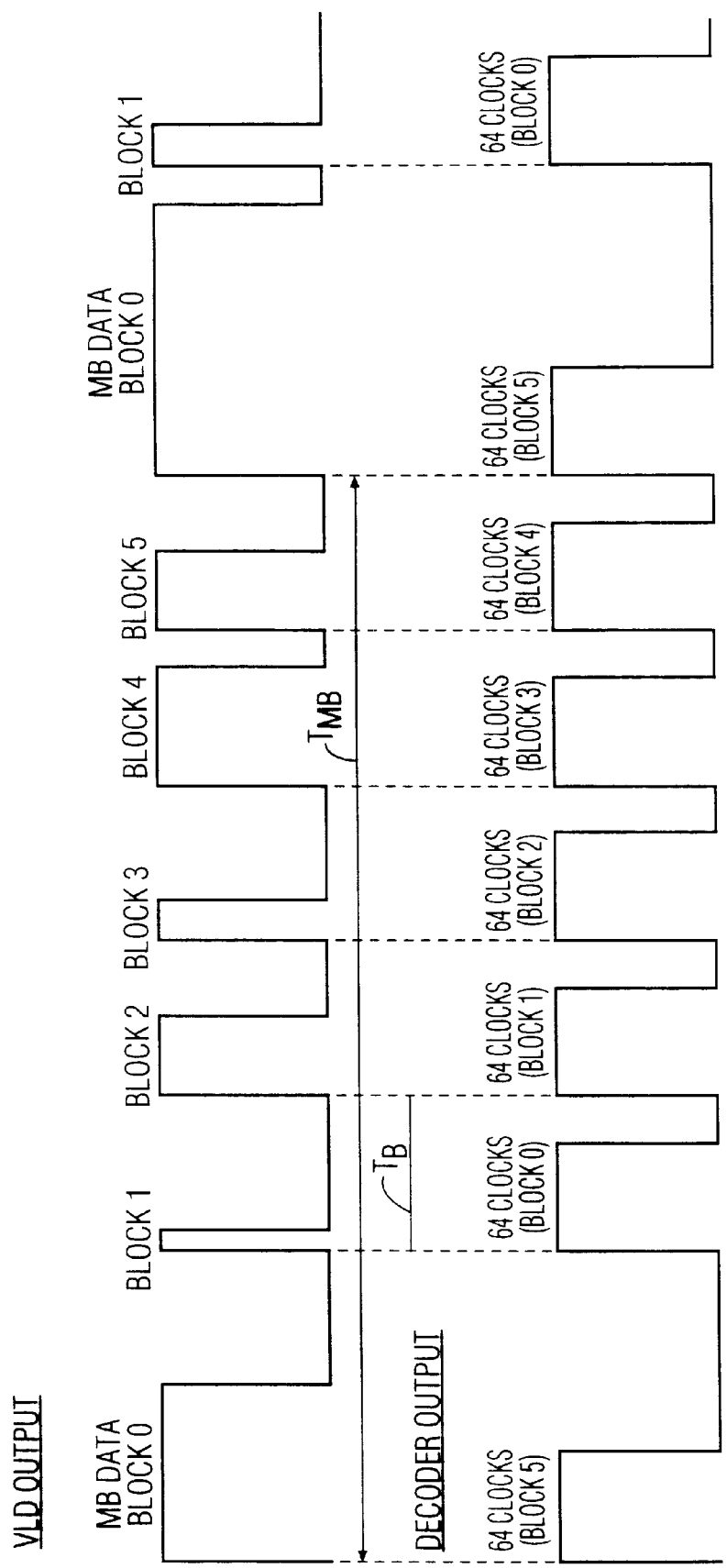
FIG. 5 shows the decoder timing.

The MPEG decoder timing is shown in FIG. 5 for fixed DCT block intervals $t_B$ and macroblock interval $t_{MB}$ in which waveforms being high indicate valid data. Therein, at both the VLD output and the overall output of the MPEG decoder a series of six blocks (Blocks 0–5) per macroblock occur. Each codeword which appears at the VLD output during an interval is completely decoded and appears at the output of the MPEG decoder during the next interval. At the VLD output, because there are a variable number of non-zero DCT coefficients per block, the data is available after a variable period of time per block of up to but usually less than 64 clock cycles, whereas at the MPEG decoder output, blocks of pixels are presented synchronously, each period where the MPEG decoder output is shown high being 64 clock cycles in duration and each period where the MPEG decoder output is shown as being low corresponds to gaps for overhead processing.

Decoding of MPEG data above the slice layer may be performed in two different ways. The first method consists of simply implementing these functions into the above decoder; it requires little additional hardware but takes some processing time away from the slice layer decoding. The second consists of decoding this data with dedicated hardware prior to the slice layer decoding; it does not have the above disadvantage, and is well suited to high-speed MPEG decoders where more than one MPEG slice from the same picture are decoded in parallel in that the same upper layer data can be used for all such slices. The latter is an important consideration because parallel decoding may be required to process the large amounts of video data encountered in high-resolution, high-speed systems such as the Grand Alliance HDTV standard.

While the present invention has been described in particular detail, it should also be appreciated that numerous modifications are possible within the intended spirit and scope of the invention. For example, although the present invention was primarily motivated by the specific requirements of the GA HDTV standard, it can nevertheless be used wherever MPEG compression is used for digital video transmission or storage.

What is claimed is:

1. An MPEG decoder for MPEG encoded data in a data stream, the data being arranged in macroblocks which are each composed of a fixed plurality of blocks of discrete cosine transform (DCT) coefficient codewords and other MPEG codewords, said decoder including a variable length decoder (VLD) which comprises:

a barrel shifter having a data input for receiving a data segment extracted from said data stream, a shift control input for receiving a shift control signal indicating a shift amount, and a data output for data elements of said data segment lying in a decoding window, said decoding window being slidable relative to said data segment in response to shifting of said barrel shifter;

code length determining means having a data input coupled to said barrel shifter output and having an output for an output signal after presentation of the data lying in the decoding window of said barrel shifter, of the length of a codeword in the presented data; and an adder accumulator having an input coupled to the output of the code length determining means and an output coupled to the shift control input of the barrel shifter;

wherein the code length determining means comprises a first code length table means which produces said code length determining means output signal for non-DC DCT coefficient codewords in a predetermined fixed period of time not exceeding a clock cycle after presentation to said first length table means of said data lying in the decoding window of said barrel shifter, and a second code length table means which produces said code length determining signal for DC DCT coefficient codewords and at least at least one other MPEG variable length code in a period of time after said presentation which is at least two of said clock cycles.

2. A decoder as claimed in claim 1, further comprising a DCT coefficient run length decoder coupled to receive DCT coefficient codewords from said VLD consisting of level/run pairs and a DCT coefficient buffer memory coupled to said DCT run length decoder for receiving decoded non-zero DCT coefficients, wherein said DCT coefficient run length decoder is configured for decoding any level/run pair in one of said clock cycles.

3. A decoder as claimed in claim 1, wherein said clock cycle is less than a macroblock interval for synchronous presentation of macroblock layer data decoded by the MPEG decoder divided by the product of the number of blocks per macroblock and the number of pixels per block.

4. A decoder as claimed in claim 2, wherein said clock cycle is less than a macroblock interval for synchronous presentation of macroblock layer data decoded by the MPEG decoder divided by the product of the number of blocks per macroblock and the number of pixels per block.

5. A decoder as claimed in claim 1, wherein said first and second code length table means have respective control inputs via which they are selectively activated, and further comprising controller means coupled to the respective code length table control inputs for selectively activating one of said first and second code length table means at a time in dependence on the type of variable length code being presented in the decoding window of said barrel shifter.

6. A decoder as claimed in claim 2, wherein said first and second code length table means have respective control inputs via which they are selectively activated, and further comprising controller means coupled to the respective code length table control inputs for selectively activating one of said first and second code length table means at a time in dependence on the type of variable length code being presented in the decoding window of said barrel shifter.

7. A decoder as claimed in claim 3, wherein said first and second code length table means have respective control inputs via which they are selectively activated, and further comprising controller means coupled to the respective code length table control inputs for selectively activating one of said first and second code length table means at a time in dependence on the type of variable length code being presented in the decoding window of said barrel shifter.

8. A decoder as claimed in claim 1, wherein the first code length table means is implemented by a combinatorial decoder.

9. A decoder as claimed in claim 2, wherein the first code length table means is implemented by a combinatorial decoder.

10. A decoder as claimed in claim 3, wherein the first code length table means is implemented by a combinatorial decoder.

11. An MPEG decoder for MPEG encoded data in a data stream, the data being arranged in macroblocks which are each composed of a fixed plurality of blocks of discrete cosine transform (DCT) coefficient codewords and other MPEG codewords, said decoder including a variable length decoder (VLD) which comprises:

a barrel shifter having a data input for receiving a data segment extracted from said data stream, a shift control input for receiving a shift control signal indicating a shift amount, and a data output for data elements of said data segment lying in a decoding window, said decoding window being slidable relative to said data segment in response to shifting of said barrel shifter;

code length determining means having a data input coupled to said barrel shifter output and having an output for an output signal after presentation of the data lying in the decoding window of said barrel shifter, of the length of a codeword in the presented data; and an adder accumulator having an input coupled to the output of the code length determining means and an output coupled to the shift control input of the barrel shifter;

wherein the code length determining means comprises a first code length table means which produces said code length determining means output signal for only non-DC DCT coefficient codewords in a predetermined fixed period of time not exceeding a clock cycle after presentation to said first length table means of said data lying in the decoding window of said barrel shifter, and a second code length table means which produces said code length determining signal for DC DCT coefficient codewords and at least one other MPEG variable length code in a period of time after said presentation which is at least two of said clock cycles.

* * * * *